(12) United States Patent
Chang et al.

(10) Patent No.: US 12,733,518 B2
(45) Date of Patent: Sep. 8, 2026

(54) CIRCUIT BOARD AND MANUFACTURING METHOD THEREOF

(71) Applicant: DAEDUCK ELECTRONICS CO., LTD., Ansan-si (KR)

(72) Inventors: Seon-Kyu Chang, Seoul (KR); Hee-Il Ryu, Gyeonggi-do (KR); Hyang-Joo Kim, Ansan-si (KR); Han-Sung Lee, Siheung-si (KR)

(73) Assignee: DAEDUCK ELECTRONICS, CO., LTD., Gyeonggi-Do (KR)

(*) Notice: Subject to any disclaimer, the term of this patent is extended or adjusted under 35 U.S.C. 154(b) by 387 days.

(21) Appl. No.: 18/409,863

(22) Filed: Jan. 11, 2024

(65) Prior Publication Data

US 2024/0421094 A1 Dec. 19, 2024

(30) Foreign Application Priority Data

Jun. 13, 2023 (KR) ........................ 10-2023-0075328

(51) Int. Cl.

*H01L 23/538* (2006.01)
*H10W 70/05* (2026.01)
*H10W 70/60* (2026.01)
*H10W 90/00* (2026.01)

(52) U.S. Cl.

CPC .......... *H10W 70/611* (2026.01); *H10W 70/05* (2026.01); *H10W 90/00* (2026.01); *H10W 90/401* (2026.01); *H10W 90/724* (2026.01)

(58) Field of Classification Search

CPC . H10W 90/401; H10W 90/00; H10W 70/611; H10W 70/05

See application file for complete search history.

(56) References Cited

U.S. PATENT DOCUMENTS

2020/0152566 A1* 5/2020 Oh ........................ H10W 70/65
2022/0173067 A1* 6/2022 Sandstrom ............ H10W 90/00

FOREIGN PATENT DOCUMENTS

KR 10-2014-0114932 A 9/2014
KR 10-2020-0092236 A 8/2020
KR 10-2021-0056853 A 5/2021
KR 20220075112 A * 6/2022 ............ H05K 1/115

* cited by examiner

*Primary Examiner* — William C Trapanese

(74) *Attorney, Agent, or Firm* — Ajay A. Jagtiani; Miles & Stockbridge P.C.

(57) ABSTRACT

The present invention is characterized by fabricating a cavity in the package substrate and embedding an interconnection device in the cavity, so that the height level of the upper copper bump of the interconnection device is aligned with that of the copper bump of the outer layer of the circuit board, which allows chips to be mounted not only on the interconnection device but on the outer layer of the circuit board in a simultaneous manner directly through the copper bumps of the interconnection device and the outer layer.

3 Claims, 20 Drawing Sheets

CIRCUIT BOARD AND MANUFACTURING METHOD THEREOF

CROSS REFERENCE TO RELATED APPLICATION

This application claims priority under 35 USC § 119 to Korean Patent Applications No. 10-2023-0075328 (Filing Date: Jun. 13, 2023), the contents of which are incorporated herein by reference in their entirety. The list of the prior art is the following: Korean Patent Publication No. 10-2014-0114932, Korean Patent Publication No. 10-2020-0092236, and Korean Patent Publication No. 10-2021-0056853.

FIELD OF THE INVENTION

The present invention relates to a circuit board structure and manufacturing method thereof, more particularly to a package substrate having multiple chips mounted on the board. More specifically, the present invention relates a circuit board structure and manufacturing method that electrically connect multiple dies or chips to each other on the surface of the circuit board.

BACKGROUND OF THE INVENTION

With the advent of the 5G era, we need to develop a high-performance and high-integration-density circuit board which can accommodate not only huge amount of data transmission but also super-fast transmission rate. Recently, the demand for high-performance servers, networks, AI (artificial intelligence) chips, and edge computing is steadily soaring, which results in a great deal of research efforts on the surface-mounting technology of multiple chips (hereinafter referred to as chips and dies interchangeably and collectively referred to as electronic components) on a single package substrate which is actively underway for the transmission of huge amounts of data per second.

Typical examples are interposer and fan out technologies that can connect the circuit board and die together, and companies including PCB manufacturers, OSAT (Outsourced Semiconductor Assembly and Test) companies, and semiconductor foundries are involved in this area of research and development.

FIG. 1 illustrates the interposer technology according to the prior art. Referring to FIG. 1, we should note that the interposer technology makes it possible to connect the dies 10, 20, 30 having fine pitch electrode to the copper-pad of the circuit board 100 having a coarse pitch, which, however, has a technical limit because extra auxiliary substrates 50, 60 are needed in addition to the interposer 40 and the substrate 100.

As another prior art, inventors proposed a bridge technology shown in FIG. 2 wherein silicon bridge 90 is embedded in the substrate 100 for interconnecting chips 10 and 20. However, since the silicon bridge is fragile and easily breakable due to bending problem that production yield is too low and the manufacturing cost is bound to be very high. In addition, the bridge technology has a technical limit in that the bridge surface should be equipped with an interconnection connection (FLI; First-Level Interconnection) or joints because the bridge should be buried deep in the board.

SUMMARY OF THE INVENTION

Accordingly, the present invention is designed to solve the aforementioned problems of the prior art and provide a technology which makes it possible to interconnect multiple chips on the circuit board in a direct, simple-processing and cost-effective manner without using the interposer substrate.

To achieve the goal of the present invention, this invention has a feature in that an interconnection device is embedded in a cavity in such a way that the height level of the upper copper bump of the interconnection device is aligned with that of the copper bump of the outer layer of the circuit board, which allows chips to be mounted not only on the interconnection device but on the outer layer of the circuit board in a simultaneous manner directly through the copper bumps without using an auxiliary buffering device.

The present invention is characterized in that the height level of the bump of the interconnection device and that of the outer layer of the circuit board are aligned to the same level within ±100 μm by adjusting the depth of the cavity, the thickness of the interconnection device, the thickness of the intervening adhesive (DAF/Paste).

As a preferred embodiment for the interconnection device in accordance with the present invention, an interposer having a through-hole-via such as a TSV (Through Silicon Via), a TSV functional device, a bridge element or a bridge (will be collectively referred as bridge) having a routing path for chip interconnection.

As a preferred embodiment for the cavity processing for embedding the interconnection device, the mechanical drilling like a drill router, the wet etch with an chemical etchant, or a laser drill can be employed for ensuring to prepare a cavity with a predetermined depth D. The bottom surface of the cavity can be processed in such a way that either the copper circuit layer or the insulating layer is exposed for contact.

As a good embodiment for embedding and fixing the interconnection device in the cavity, we can attach and bond the interconnection device on the bottom surface of the cavity through an adhesive like DAF (dry adhesive film) and paste. As another embodiment, the bottom bumps of the interconnection device is made in contact with the copper pads (bumps) of the exposed copper circuit of the core substrate by soldering.

Here in the process of installing the interconnection device on the bottom surface of the cavity, it is desirable to make sure that the height level of the upper bumps should be aligned with that of the outer layer bumps of the adjacent area of the circuit board within the error bound of ±100 μm by adjusting the depth D of the cavity, the thickness of the interconnection device, the size of the bump and solder, the thickness of the adhesive or the adhesive paste.

In the following the connection part for interconnecting electrical signal is called bump, which is also called pad, pillar, solder, contact, connector, joint, etc. in the related industry.

As a preferred embodiment for finishing treatment after attaching the interconnection device in the cavity, a first and second embodiment employs a technique characterized by underfill the gap between the interconnection device and the cavity wall with insulating material during the subsequent assembly step. A third and fourth embodiment utilizes a technique characterized by printing a photosensitive insulating material such as solder resist all over the surface for making an opening for the copper bump and thereby simultaneously filling the gap with the flow of the insulating material.

The chips, i.e. electronic component, which are mounted on the circuit board and on the interconnection device in accordance with the present invention include several types of chips such as passive elements like MLCC as well as logic and memory semiconductor chips.

The present invention makes it possible to directly interconnect multiple chips and circuit board without using the interposer. The present invention also makes it possible to mount chips with fine pitch on the bumps with coarse pitch of the circuit board.

DETAILED DESCRIPTION OF THE INVENTION

Figure 1:
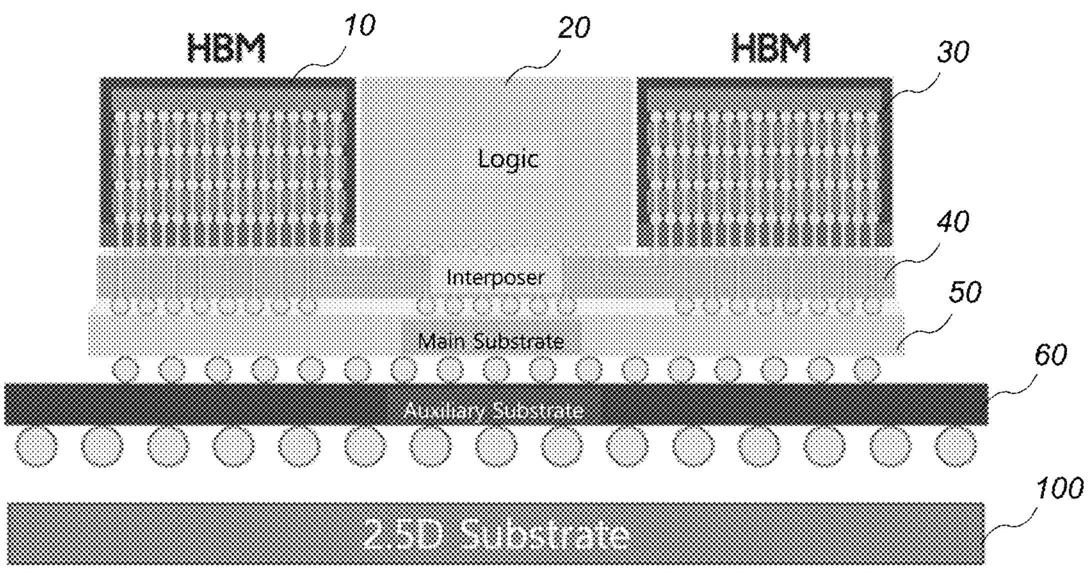
FIG. 1 is a schematic diagram illustrating a circuit board with an interposer for chip to chip interconnection according to the prior art.
Figure 2:
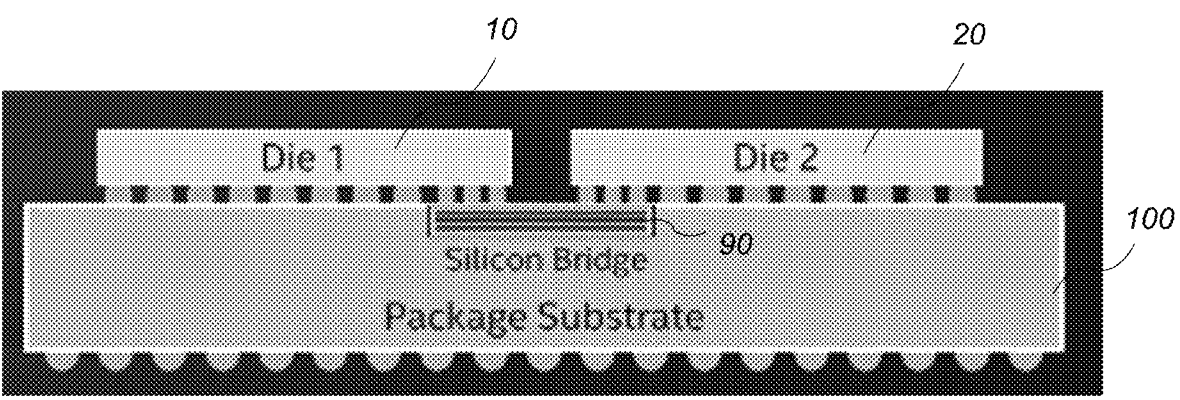
FIG. 2 is a schematic diagram illustrating a circuit board with a bridge for chip to chip interconnection according to the prior art.

The present invention is characterized by fabricating a cavity in the package substrate and embedding an interconnection device in the cavity, so that the height level of the upper copper bump of the interconnection device is aligned with that of the copper bump of the outer layer of the circuit board, which allows chips to be mounted not only on the interconnection device but on the outer layer of the circuit board in a simultaneous manner directly through the copper bumps of the interconnection device and the outer layer.

The present invention discloses a device which consists of one or more electronic components, a circuit board having a cavity with a prescribed depth D from the outer surface, and an interconnection device installed in the cavity for electrically interconnect the electronic components, characterized in that the interconnection device is installed in the cavity in such a way that the height level of the upper bump of the interconnection device and that of the outer layer of the circuit board are aligned to the same level within a predetermined error bound E and thereby the electronic components are mounted both on the surface of the interconnection device and on the circuit board at the same height level.

The present invention also discloses a manufacturing method consisting steps of: (a) preparing a circuit board having a copper circuit on the surface of the outer layer; (b) making a cavity with a predetermined depth (D) and width (W) at a predetermined location of the circuit board; (c) settling the interconnection device in the cavity; and (d) surface-mounting one or more electronic components on the bumps of the interconnection device and the outer layer, characterized in that the interconnection device is installed in the cavity in such a way that the height level of the upper bump of the interconnection device and that of the outer layer of the circuit board are aligned to the same level within a predetermined error bound E and thereby the electronic components are mounted both on the surface of the interconnection device and on the circuit board at the same height level.

As a preferred embodiment of an interconnection device in accordance with the present invention, an interposer having a through hole via such as TSV (Through Silicon Via), a functional device having a through hole via function such as a TSV functional die, a bridge element or a bridge having a wiring element (Routing Path) for chip connection may be used.

In the followings, we will explain in detail on the interconnection device and a circuit board having the same by referring to the attached drawings, FIGS. 3 to 6.

FIGS. 3*a* to 3*d* are cross sectional drawings illustrating the processing sequences in accordance with a first embodiment of the present invention.

The first embodiment of the present invention is the case when the bridge element is employed as an interconnection device on the package board which has finished the process up to solder resist printing.

Figure 3A:
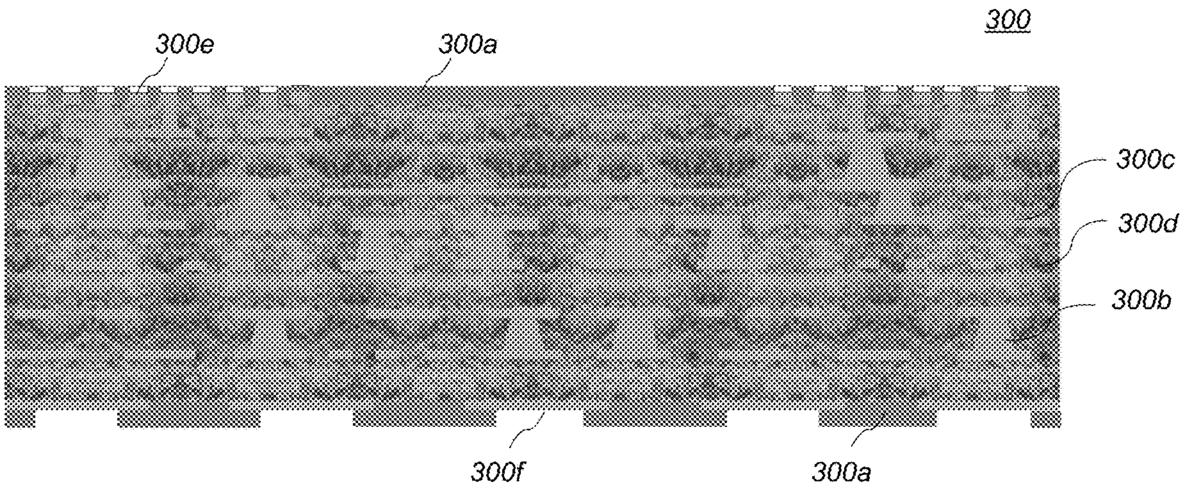
FIGS. 3*a* to 3*d* are cross sectional drawings illustrating the processing sequences in accordance with a first embodiment of the present invention.

FIG. 3*a* is a cross sectional view illustrating the typical multiple-level package board 300 which is manufactured according to the typical process of the prior art. Referring to FIG. 3*a*, a multiple-level copper circuit 300*c* is formed across the insulating layer 300*d* which provides interlevel vias 300*b* for electrical connection between the copper circuits and pad 300*f* and bump 300*e* are formed on the outer layer for electrical contact. In addition, a solder resist 300*a* is printed all over the surface for the protection of the circuit on the outer layer.

Thereafter, a cavity 310 is formed through etch process in the circuit board 300. For the etch process for making a cavity, a physical etch process such as a drill router, a chemical etch process such as chemical solution, and a laser drill such as UV laser or a $CO_2$ laser can be employed.

Figure 3B:
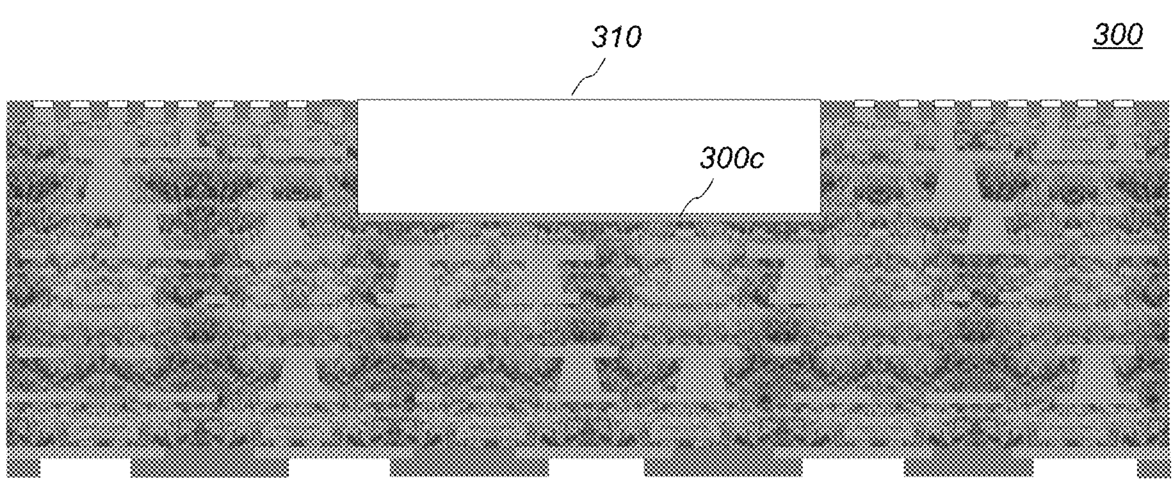

Referring to FIG. 3*b*, we can see a preferred embodiment in accordance with the present invention wherein a cavity has been made on the copper pad by etching down to the copper layer of the core. However, the scope of the present invention does not necessarily limit to this embodiment. For instance, we can make a cavity in such a way that the epoxy or resin layer is exposed as a bottom surface. As another example, we can continue the etch process and make a cavity in such a way that a copper circuit layer with bumps forms a bottom surface of the cavity.

Figure 3C:
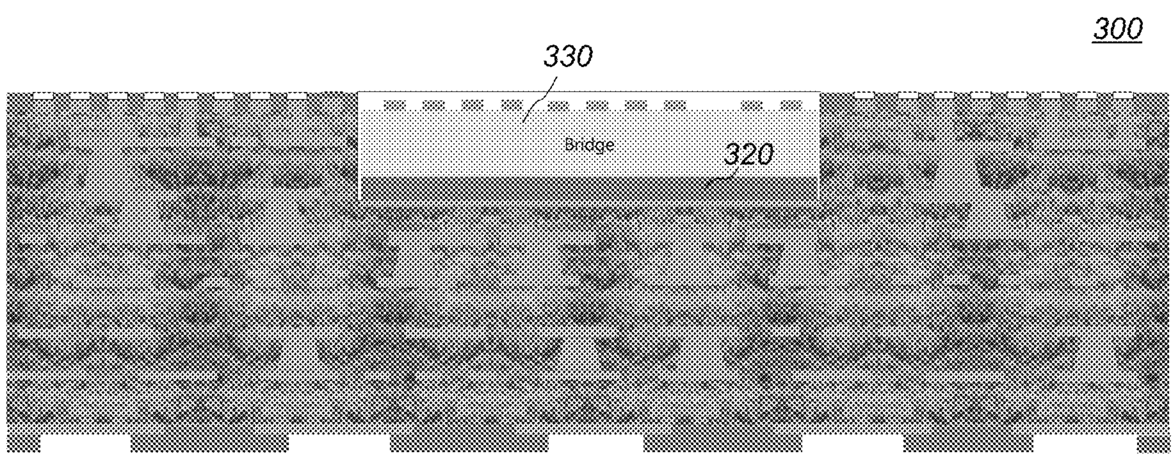

Referring to FIG. 3*c*, we now form an adhesive 320 on the bottom surface of the cavity 310 and install the interconnection device 330 in accordance with the present invention. As a preferred embodiment for the interconnection device 330 of the present invention, a silicon bridge or an organic bridge can be utilized. As a preferred embodiment for the adhesive 320, DAF (die attach film) or paste can be used.

Figure 3D:
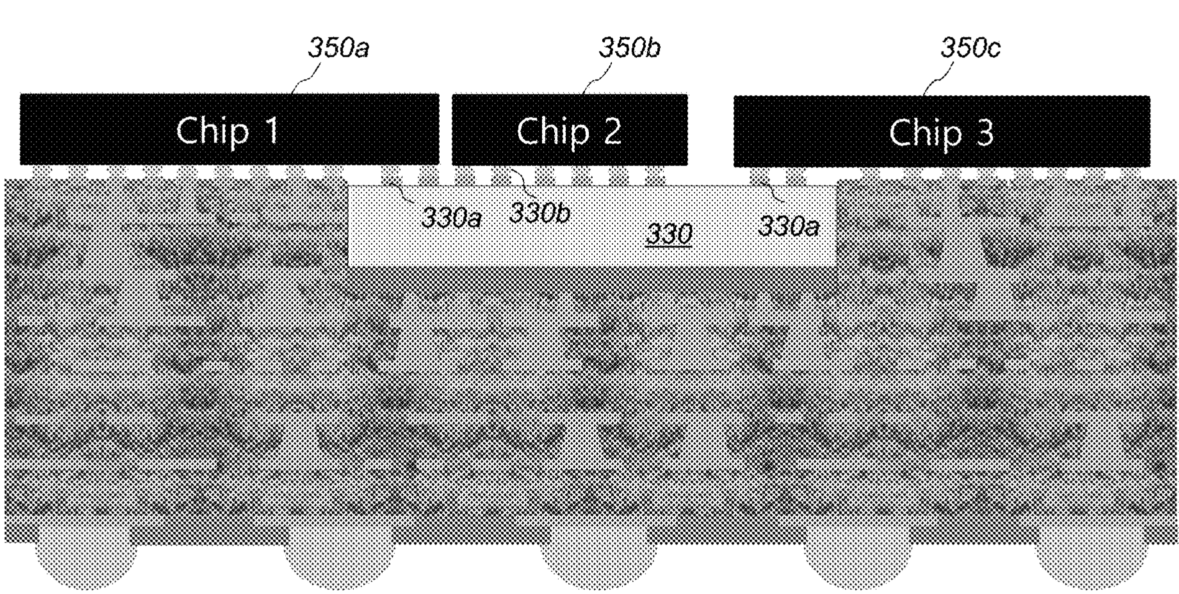

Referring to FIG. 3*d*, we perform interconnection between the electrodes of the electronic components 350*a*, 350*b*, 350*c* and those 330*a* of the interconnection device 330. As a good embodiment in accordance with the present invention, solder joint or solder joint with barrier metal can be employed. Thereafter, underfill process can be performed with molding material during the assembly step.

FIGS. 4*a* to 4*d* are cross sectional drawings illustrating the processing sequences in accordance with a second embodiment of the present invention.

The second embodiment of the present invention is the case when an interposer such as a TSV or a TSV functional device is employed as an interconnection device on the package board which has finished the process up to solder resist printing.

Figure 4A:
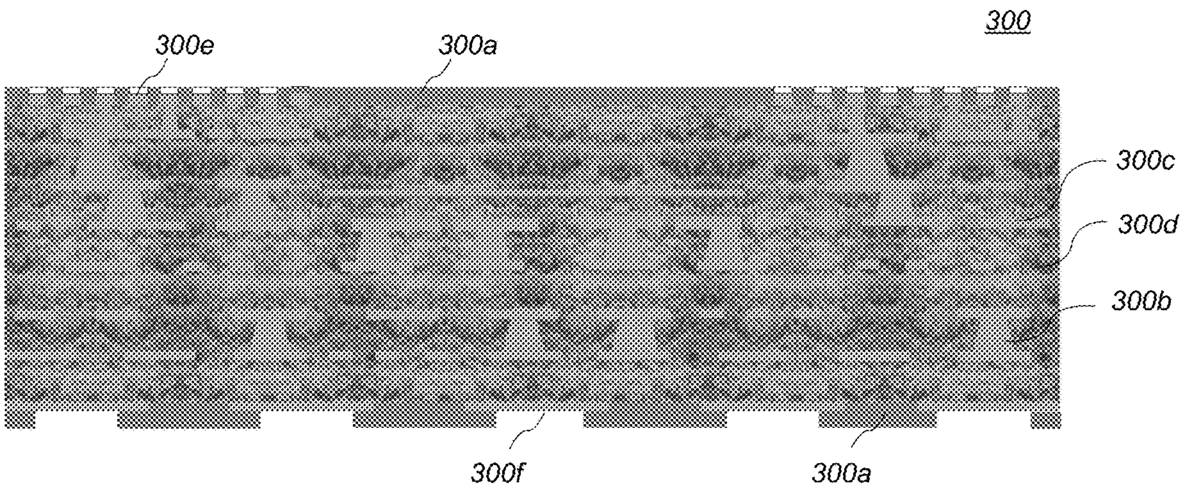
FIGS. 4*a* to 4*d* are cross sectional drawings illustrating the processing sequences in accordance with a second embodiment of the present invention.

FIG. 4*a* is a cross sectional view illustrating the typical multiple-level package board 300 which is manufactured according to the typical process of the prior art. Referring to FIG. 4*a*, a multiple-level copper circuit 300*c* is formed across the insulating layer 300*d* which provides interlevel vias 300*b* for electrical connection between the copper circuits and pad 300*f* and bump 300*e* are formed on the outer layer for electrical contact. In addition, a solder resist 300*a* is printed all over the surface for the protection of the circuit on the outer layer.

Thereafter, a cavity 310 is formed through etch process in the circuit board 300. For the etch process for making a cavity, a physical etch process such as a drill router, a chemical etch process such as chemical solution, and a laser drill such as UV laser or a $CO_2$ laser can be employed.

Figure 4B:
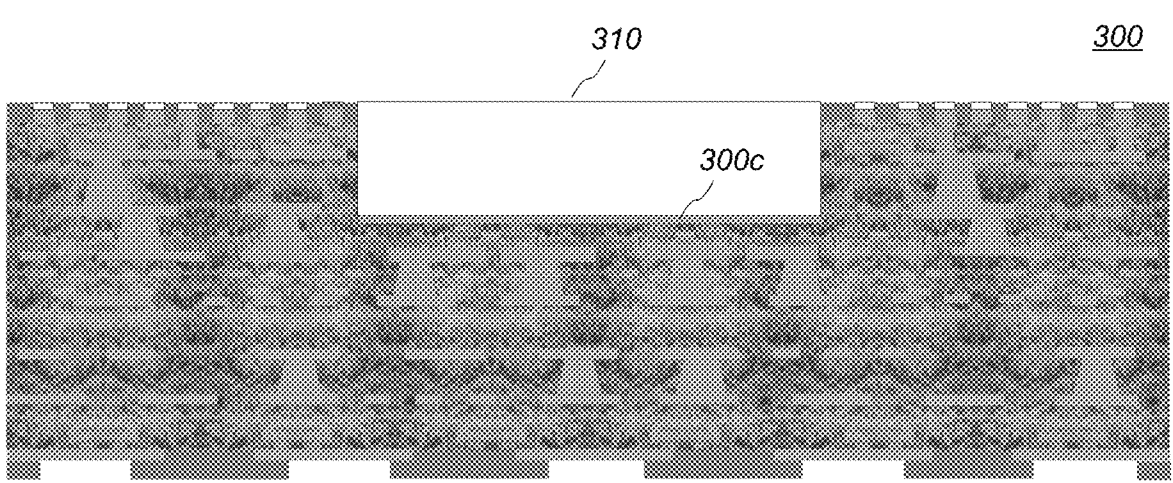

Referring to FIG. 4*b*, we can see a preferred embodiment in accordance with the present invention wherein a cavity 310 has been made on the copper pad by etching down to the copper layer of the core. However, the scope of the present invention does not necessarily limit to this embodiment. For instance, we can make a cavity in such a way that the epoxy or resin layer is exposed as a bottom surface. As another example, we can continue the etch process and make a cavity in such a way that a copper circuit layer with bumps forms a bottom surface of the cavity.

Figure 4C:
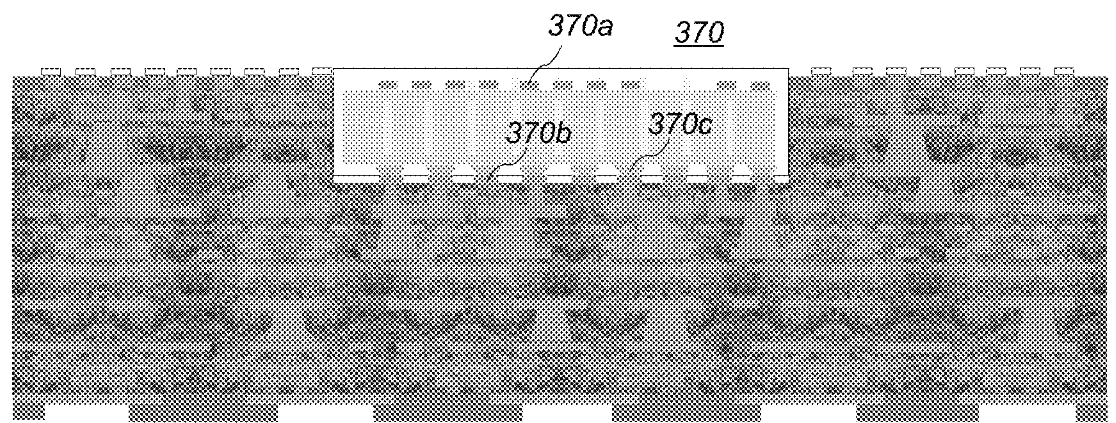

Referring to FIG. 4*c*, we now mount the interconnection device 370 on the bumps 370*b* of the bottom surface of the cavity 310 by solder 370*c* in accordance with the present invention (bottom electrode not shown in the figure). As a preferred embodiment for the interconnection device 370 of the present invention, an interposer such as a TSV or a TSV functional device can be utilized.

Figure 4D:
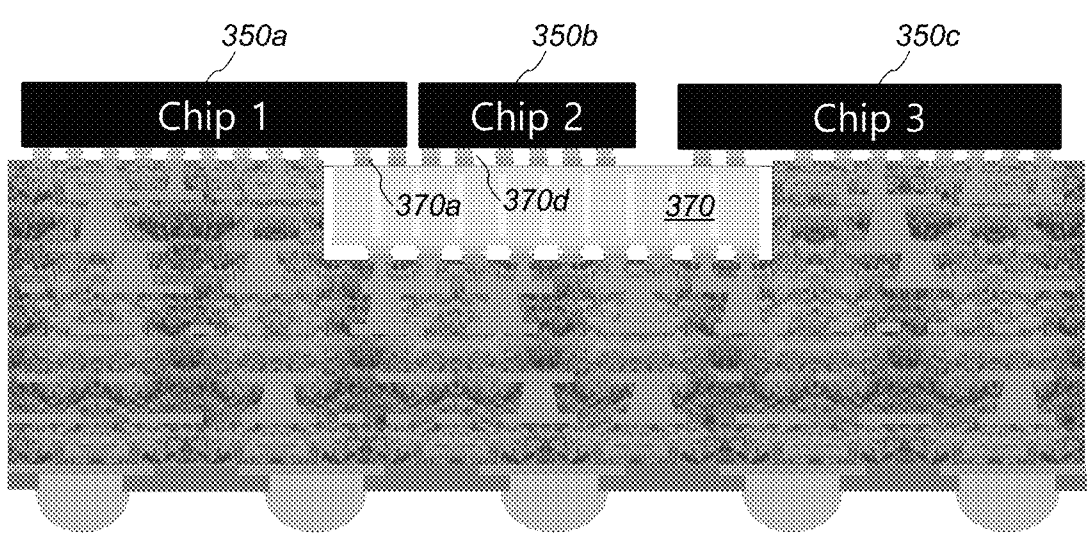

Referring to FIG. 4*d*, we perform interconnection between the electrodes of the electronic components 350*a*, 350*b*, 350*c* and those 370*a* of the interconnection device 370. As a good embodiment in accordance with the present invention, solder joint or solder joint with barrier metal can be employed. Thereafter, underfill process can be performed with molding material during the assembly step.

FIGS. 5*a* to 5*d* are cross sectional drawings illustrating the processing sequences in accordance with a third embodiment of the present invention.

The third embodiment of the present invention is the case when a bridge is employed as an interconnection device in the cavity.

Figure 5A:
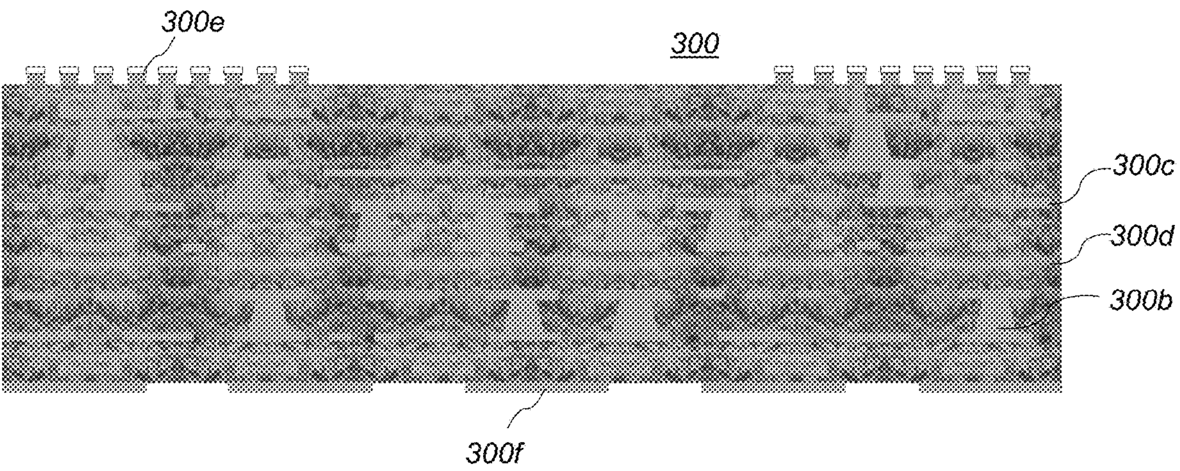
FIGS. 5*a* to 5*e* are cross sectional drawings illustrating the processing sequences in accordance with a third embodiment of the present invention.

FIG. 5*a* is a cross sectional view illustrating the typical multiple-level package board 300 which is manufactured according to the typical process of the prior art. Referring to FIG. 5*a*, a multiple-level copper circuit 300*c* is formed across the insulating layer 300*d* which provides interlevel vias 300*b* for electrical connection between the copper circuits and pad 300*f* and bump 300*e* are formed on the outer layer for electrical contact. Here, we should note that a solder resist layer is not formed in the third embodiment in contrast to the first embodiment in FIG. 3*a*.

Thereafter, a cavity 310 is formed through etch process in the circuit board 300. For the etch process for making a cavity, a physical etch process such as a drill router, a chemical etch process such as chemical solution, and a laser drill such as UV laser or a $CO_2$ laser can be employed.

Figure 5B:
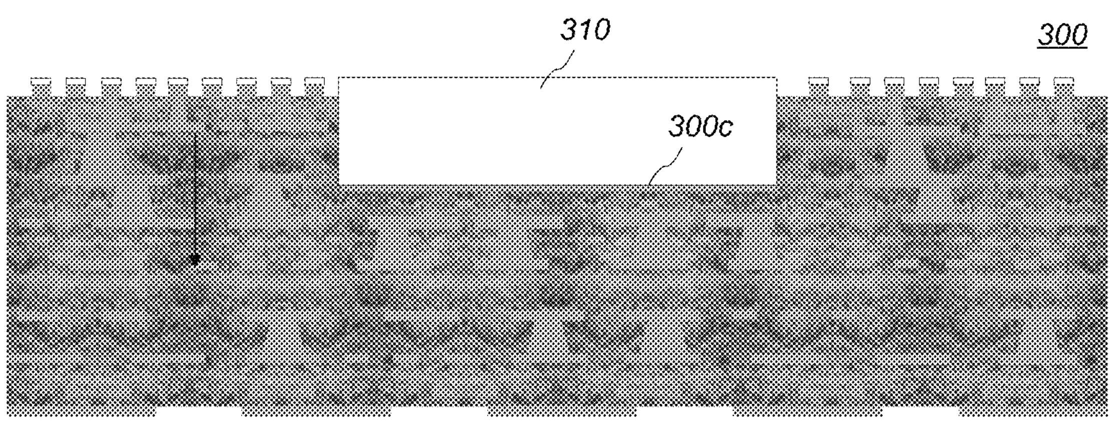

Referring to FIG. 5*b*, we can see a preferred embodiment in accordance with the present invention wherein a cavity 310 has been made on the copper pad by etching down to the copper layer of the core. However, the scope of the present invention does not necessarily limit to this embodiment. For instance, we can make a cavity in such a way that the epoxy or resin layer is exposed as a bottom surface. As another example, we can continue the etch process and make a cavity in such a way that a copper circuit layer with bumps forms a bottom surface of the cavity.

Figure 5C:
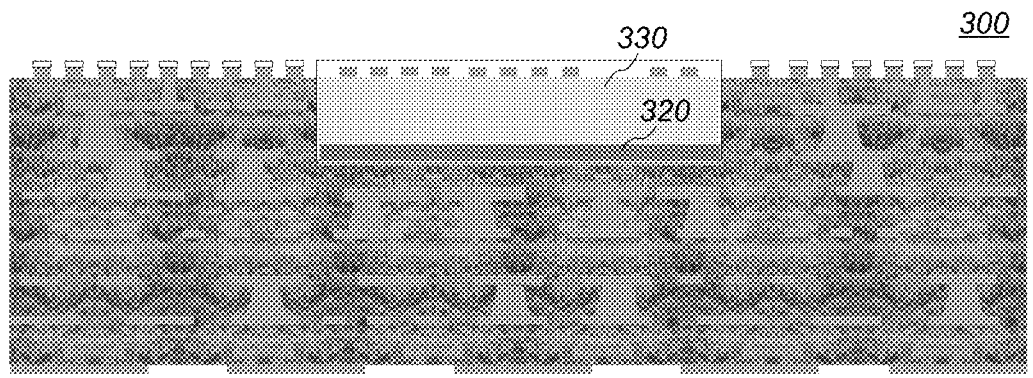

Referring to FIG. 5*c*, we now mount the interconnection device 330 on the adhesive 320 of the bottom surface of the cavity 310 in accordance with the present invention. As a preferred embodiment for the interconnection device 330 of the present invention, a silicon bridge or an organic bridge can be utilized. As a preferred embodiment for the adhesive 320, DAF (die attach film) or paste can be used.

Figure 5D:
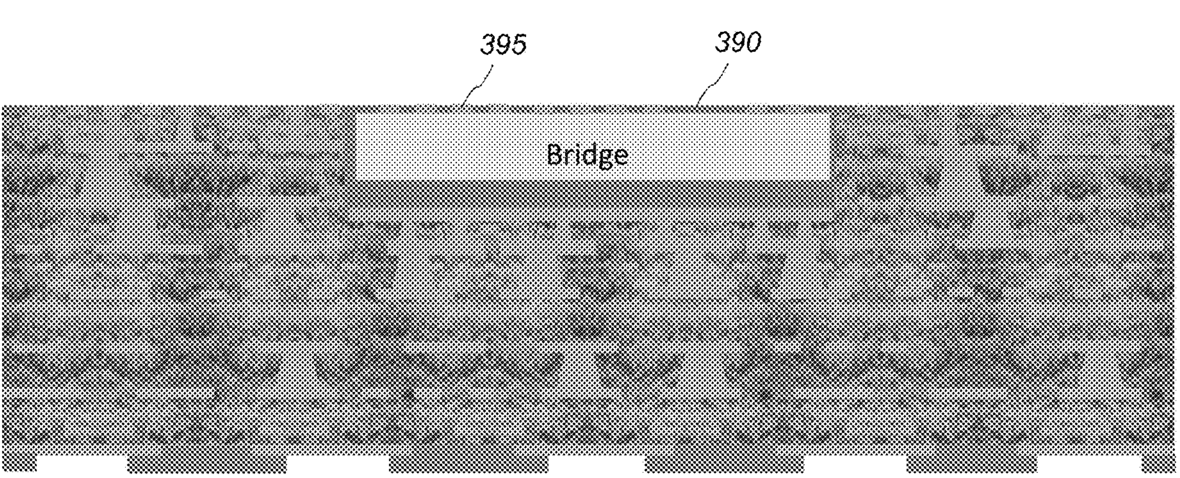

Referring to FIG. 5*d*, we now print a photosensitive insulating ink 390 such as solder resist over the surface of the circuit board according to a predetermined circuit pattern. Here, the upper electrode 395 should be exposed and the gap between the interconnection device and the cavity wall is filled with the ink and therefore sealed for solid settlement.

Figure 5E:
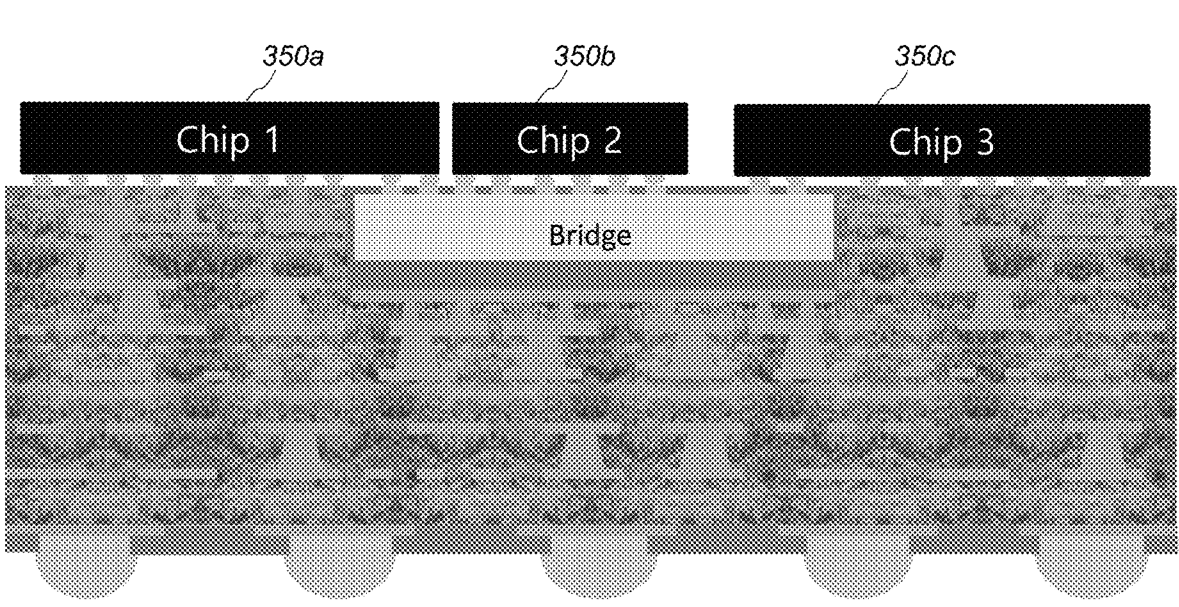

Referring to FIG. 5*e*, a metal bump is formed which is finished with copper and gold electroplating. Thereafter, the electrical contact is made with multiple chips, or dies 350*a*, 350*b*, 350*c*. As a preferred embodiment in accordance with the invention, a solder joint or a solder joint with barrier metal can be utilized.

FIGS. 6*a* to 6*d* are cross sectional drawings illustrating the processing sequences in accordance with a fourth embodiment of the present invention.

The fourth embodiment of the present invention is the case when an interposer is employed as an interconnection device in the cavity.

Figure 6A:
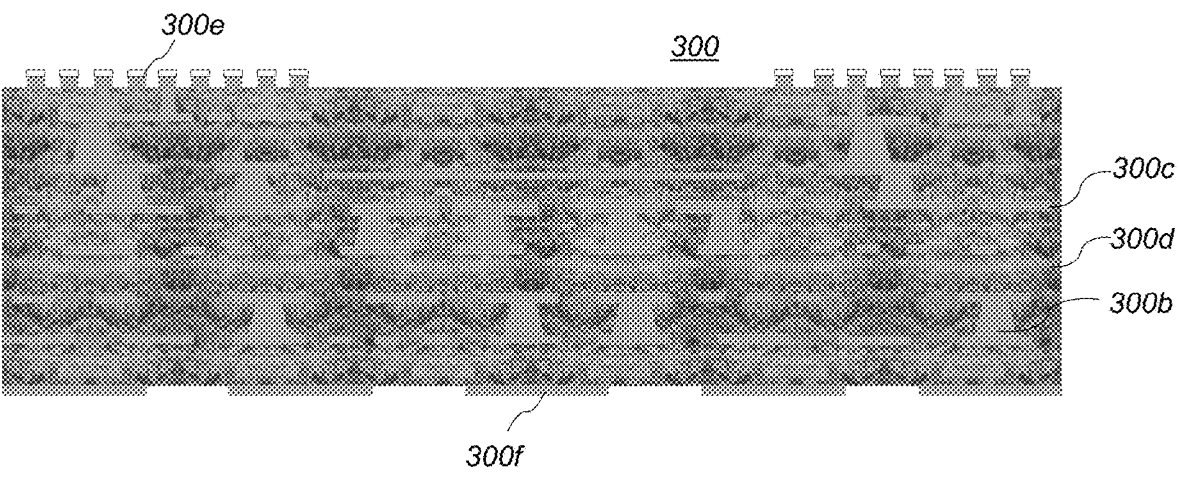
FIGS. 6*a* to 6*e* are cross sectional drawings illustrating the processing sequences in accordance with a fourth embodiment of the present invention.

FIG. 6*a* is a cross sectional view illustrating the typical multiple-level package board 300 which is manufactured according to the typical process of the prior art. Referring to FIG. 6*a*, a multiple-level copper circuit 300*c* is formed across the insulating layer 300*d* which provides interlevel vias 300*b* for electrical connection between the copper circuits and pad 300*f* and bump 300*e* are formed on the outer layer for electrical contact. Here, we should note that a solder resist layer is not formed in the third embodiment in contrast to the first embodiment in FIG. 3*a*.

Thereafter, a cavity 310 is formed through etch process in the circuit board 300. For the etch process for making a cavity, a physical etch process such as a drill router, a chemical etch process such as chemical solution, and a laser drill such as UV laser or a $CO_2$ laser can be employed.

Figure 6B:
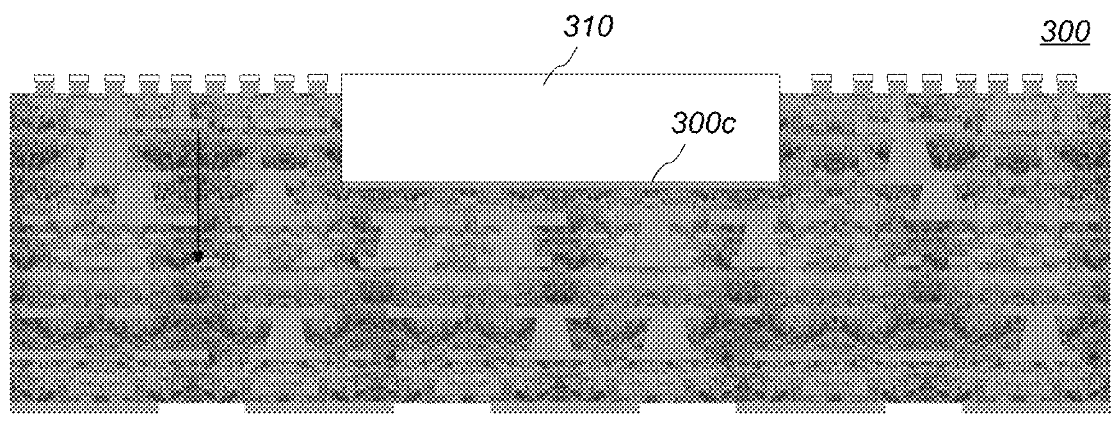

Referring to FIG. 6*b*, we can see a preferred embodiment in accordance with the present invention wherein a cavity 310 has been made on the copper pad by etching down to the copper layer of the core. However, the scope of the present invention does not necessarily limit to this embodiment. For instance, we can make a cavity in such a way that the epoxy or resin layer is exposed as a bottom surface. As another example, we can continue the etch process and make a cavity in such a way that a copper circuit layer with bumps forms a bottom surface of the cavity.

Figure 6C:
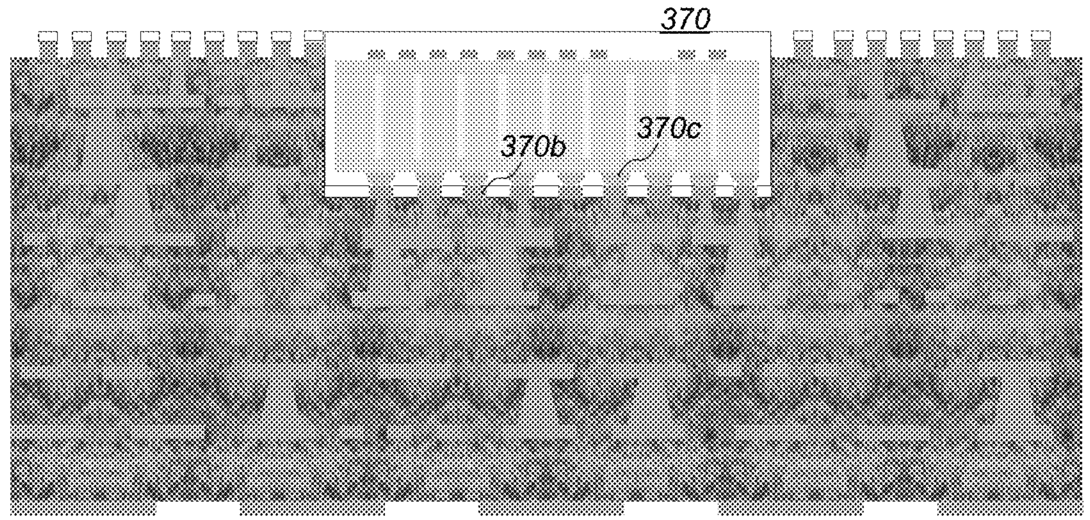

Referring to FIG. 6*c*, we now mount the interconnection device 370 on the bumps 370*b* of the bottom surface of the cavity 310 by solder 370*c* in accordance with the present invention (bottom electrode not shown in the figure). As a preferred embodiment for the interconnection device 370 of the present invention, an interposer such as a TSV or a TSV functional device can be utilized.

Figure 6D:
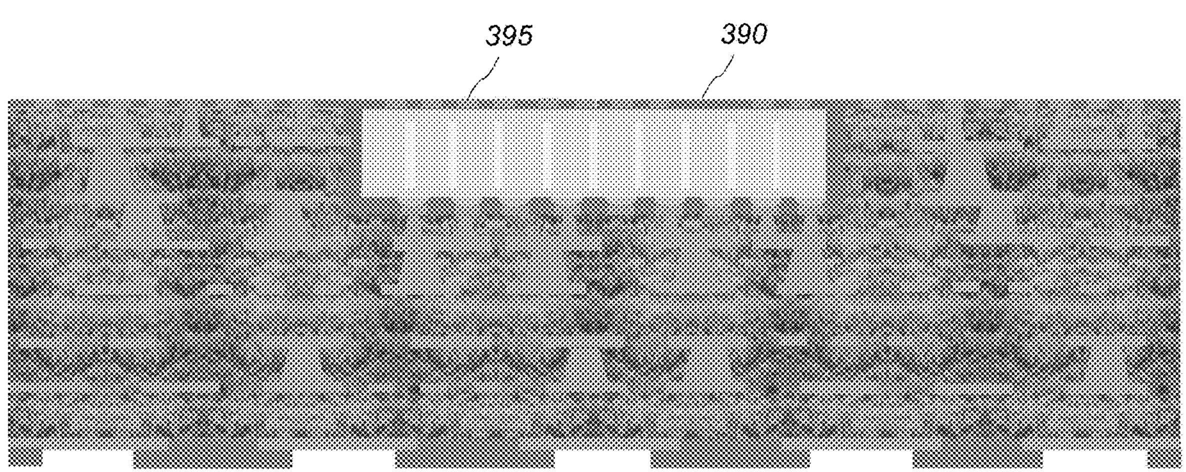

Referring to FIG. 6*d*, we now print a photosensitive insulating ink 390 such as solder resist over the surface of the circuit board according to a predetermined circuit pattern. Here, the upper electrode 395 should be exposed and the gap between the interconnection device and the cavity wall is filled with the ink and therefore sealed for solid settlement.

Figure 6E:
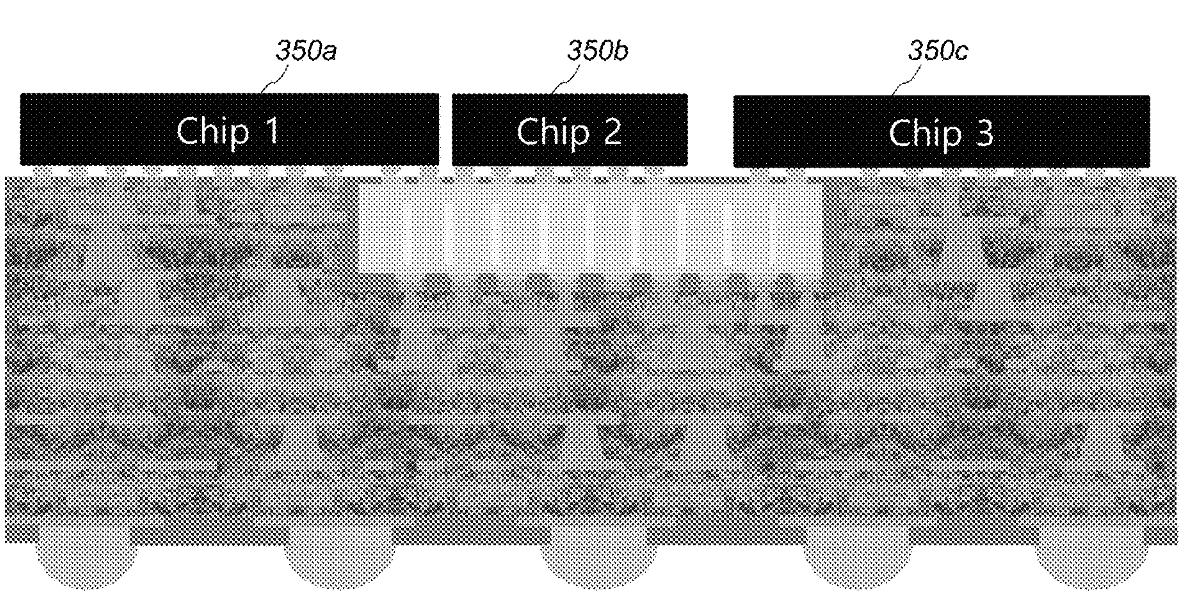

Referring to FIG. 6*e*, a metal bump is formed which is finished with copper and gold electroplating. Thereafter, the electrical contact is made with multiple chips, or dies 350*a*, 350*b*, 350*c*. As a preferred embodiment in accordance with the invention, a solder joint or a solder joint with barrier metal can be utilized.

The foregoing has been a rather extensive improvement of the features and technical advantages of the present invention in order to better understand the scope of the patent claims of the invention to be described later. The additional features and advantages that constitute the patent claims of the present invention will be detailed below. It should be recognized by those skilled in the field of the present that the concept and specific embodiments of the present invention that have been disclosed can be readily used as the basis for the design or modification of other structures to perform purposes similar to the present invention.

Further in addition, the invention concept and embodiment disclosed in the present invention may be used by skilled persons in the field of the art as a basis for modifying or designing a different structure to accomplish the same purpose of the present invention. In addition, such modified or altered equivalence structure by a person skilled in the field of technology is subject to various evolutions, substitutions, and variations within the scope of the patent claims, as long as it does not go beyond the idea or scope of the invention described above. it will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing a circuit board, comprising steps of:

(a) preparing a circuit board having a multilayer circuit and interlayer vias, having bumps formed on the outer layer, and optionally coated with solder resist or a photosensitive insulating layer;

(b) making a cavity with a predetermined depth D in the circuit board wherein the bottom surface of the cavity is formed with a copper layer;

(c) attaching an interconnect element, having bumps on the upper surface and through-vias or a wiring layer inside, to the bottom surface of the cavity using an adhesive or adhesive paste;

(d) printing solder resist or a photosensitive insulating material on the surface of the outer layer in such a way that the bump surface of the interconnect element is exposed, and the gap between the interconnect element and the cavity space is filled with either the solder resist or the photosensitive insulating material; and (e) surface-mounting one or more electronic components on the circuit board so that the electronic components are electrically interconnected by soldering the electrodes of the electronic components to the bumps on the upper surface of the interconnecting element or to the bumps on the outer layer surface of the circuit board, characterized in that the depth D of the cavity, the thickness of the interconnection element, the size of the bump or solder, and the thickness of the adhesive or adhesive paste are adjusted so that the error E between the height level of the bump formed on the upper surface of the interconnection element and the height level of the bump formed on the outer layer of the circuit board is within the range of ±100 μm.

2. A method for manufacturing a circuit board, comprising steps of:

(a) preparing a circuit board having a multilayer circuit and interlayer vias, having bumps formed on the outer layer, and optionally coated with solder resist or a photosensitive insulating layer;

(b) making a cavity with a predetermined depth D in the circuit board wherein the bottom surface of the cavity is to have bumps according to a selected circuit pattern;

(c) attaching an interconnect element, having bumps on the upper and lower surfaces and through-vias or a wiring layer inside, such that the bumps on the lower surface of the interconnection element are solder-bonded to the bumps on the bottom surface of the cavity;

(d) printing solder resist or a photosensitive insulating material on the surface of the outer layer in such a way that the bump surface of the interconnect element is exposed, and the gap between the interconnect element and the cavity space is filled with either the solder resist or the photosensitive insulating material; and (e) surface-mounting one or more electronic components on the circuit board so that the electronic components are electrically interconnected by soldering the electrodes of the electronic components to the bumps on the upper surface of the interconnecting element or to the bumps on the outer layer surface of the circuit board, characterized in that the depth D of the cavity, the thickness of the interconnection element, the size of the bump or solder, and the thickness of the adhesive or adhesive paste are adjusted so that the error E between the height level of the bump formed on the upper surface of the interconnection element and the height level of the bump formed on the outer layer of the circuit board is within the range of ±100 μm.

3. An electronic device comprising:

a circuit board having a multilayer circuit and interlayer vias wherein bumps are formed on the outer layer which is selectively coated either with a solder resist or with a photosensitive insulating layer;

an interconnect element having bumps on its upper surface and through-vias or a wiring layer inside;

a cavity with a predetermined size and a predetermined depth D processed in the circuit board, wherein the bottom surface is copper foil, the interconnect element is fixedly mounted on the copper foil on the bottom surface via an adhesive or adhesive paste, and the gap between the mounted interconnect element and the space is underfilled either by solder resist, or by a photosensitive insulating material, or by a molding sealant; and one or more electronic components soldered to either or both of the bumps of the interconnect element mounted in the cavity or the bumps on the outer layer of the circuit board, characterized in that the depth D of the cavity, the thickness of the interconnecting element, the size of the bump or solder, and the thickness of the adhesive or adhesive paste are adjusted in such a way that the error (E) between the height level of the upper surface bump of the interconnecting element and the height level of the bump formed on the outer layer of the circuit board is within the range of ±100 μm.

* * * * *